US007898440B2

(12) United States Patent
Chen

(10) Patent No.: US 7,898,440 B2
(45) Date of Patent: Mar. 1, 2011

(54) KEYBOARD FOR A HANDHELD ELECTRONIC DEVICE

(75) Inventor: Sung-Chi Chen, Taipei (TW)

(73) Assignee: Inventec Appliances Corp., Taipei (TW)

( * ) Notice: Subject to any disclaimer, the term of this patent is extended or adjusted under 35 U.S.C. 154(b) by 1063 days.

(21) Appl. No.: 11/701,465

(22) Filed: Feb. 2, 2007

(65) Prior Publication Data

US 2007/0229318 A1 Oct. 4, 2007

(30) Foreign Application Priority Data

Mar. 20, 2006 (TW) ............................... 95204603 U

(51) Int. Cl.
*H03M 11/00* (2006.01)

(52) U.S. Cl. ................ 341/22; 341/20; 341/21; 200/5 A; 200/5 B; 200/5 R; 200/547; 200/252

(58) Field of Classification Search .................... 341/20, 341/21, 22; 200/5 R, 5 A, 5 B, 547, 252
See application file for complete search history.

(56) References Cited

U.S. PATENT DOCUMENTS

| | | | | |
|---|---|---|---|---|
| 3,570,758 | A * | 3/1971 | Clemons et al. | 235/101 |
| 3,797,630 | A * | 3/1974 | Zilkha | 400/479.1 |
| 4,931,781 | A * | 6/1990 | Miyakawa | 345/160 |
| 5,664,880 | A * | 9/1997 | Johnson et al. | 473/407 |
| 5,947,616 | A * | 9/1999 | Liang | 400/491.2 |
| 6,103,979 | A * | 8/2000 | Motoyama et al. | 200/4 |
| 6,969,815 | B1 * | 11/2005 | Lu | 200/345 |
| 7,119,277 | B1 * | 10/2006 | Shotey et al. | 174/66 |
| 2002/0064018 | A1 * | 5/2002 | Suzuki | 361/288 |
| 2007/0172287 | A1 * | 7/2007 | Hirsch | 400/489 |
| 2007/0229318 | A1 * | 10/2007 | Chen | 341/22 |
| 2008/0238879 | A1 * | 10/2008 | Jaeger et al. | 345/173 |
| 2009/0160682 | A1 * | 6/2009 | Bolender et al. | 341/33 |
| 2010/0040400 | A1 * | 2/2010 | Hirsch | 400/489 |

* cited by examiner

*Primary Examiner* — Brian A Zimmerman
*Assistant Examiner* — Amine Benlagsir
(74) *Attorney, Agent, or Firm* — Birch, Stewart, Kolasch & Birch, LLP

(57) ABSTRACT

A keyboard for a handheld device includes several input keys; a front panel for mounting on an outer surface of the handheld and formed with a mounting hole for receiving a respective one of the input keys; a sliding and pressing mechanism disposed below the front panel to permit sliding movement of the input key in vertical or horizontal direction of the mounting hole; and a spring unit for providing a restoration force that permits the respective input key to retrieve its initial position upon removal of an applied force.

9 Claims, 3 Drawing Sheets

KEYBOARD FOR A HANDHELD ELECTRONIC DEVICE

FIELD OF THE INVENTION

The invention relates to a keyboard, and more particularly to a keyboard for use in a handheld electronic device.

BACKGROUND OF THE INVENTION

Due to rapid advance of electronic technology, the handheld electronic devices, such as mobile phones or personal digital assistants (PDAs), of nowadays have multipurpose functions, like sending short messages and e-mails, playing music, taking picture and making simple calculation. The handheld electronic device therefore becomes an indispensable part in our daily life. In order to provide the aforementioned multi functions, the handheld electronic device is usually provided with a keyboard for input of commands of signals, more specifically letters for inputting of words during sending of a short message.

In order to enable the user for inputting the words, the handheld electronic device is generally provided with a keyboard having a plurality sets of keys. The user may press these sets of keys when he or she wishes to input the words. Some of the handheld electronic devices (like PDAs) are provided with standard keyboards, generally known as QWERTY board like keyboard of a personal computer. The QWERTY board has a plurality of keys, each corresponding to one "Letter". Under this condition, the user can quickly input the words, by typing the keys continuously since each of the keys corresponds to a letter or a phonetic alphabet.

It is noted that the QWERTY board has a relatively large dimension since there are more than 26 keys. As a result, the handheld electronic device must also possess a bulky size in order to accommodate the sets of keys. The handheld electronic device thus cannot be constructed in compact size, thereby inconveniencing the user whenever he wants to take along the device with him. The size of the handheld electronic can be reduced to facilitate the user to carry along with him. The size reduction of the device may lead to some difficulties, such as the keys are too small to operate or the printed symbol on the key is not easily visible.

In some of the handheld electronic devices, the QWERTY board is substituted by a touch screen or touch interface in order to minimize the dimension of the device so as to eliminate the aforementioned drawbacks. The user can directly press the touch screen by finger or stylus whenever he wishes to input a signal. Input of words or signals by means of finger or stylus is slow when compared with the conventional typing habit of the user. In addition, the image or letter in the touch screen is not easily visible due to over brightness of the ambient light (the sun), thereby causing inconvenience to operate the touch screen.

In order to eliminate the aforementioned drawbacks, another handheld electronic device has been proposed such that the latter includes a plurality of condensed keys, i.e. each corresponds to several letters or numerals. For example, when sending a short message, the user can press the key having the numeral 3 for 6 times in case he wishes to input the letter "f". When each of the condensed keys is thus arranged, the dimension the handheld electronic device is greatly reduced to facilitate the user to carry along with him.

Since it requires the user to press a condensed key several times in order to result in a specific letter, the condensed key lacks the advantage offered by the QWERTY keyboard. Sometimes, the user may accidentally over press the condensed key, thereby resulting in an undesired letter. In other words, several errors may occur and it causes time waste to use the condensed keys for input of words.

SUMMARY OF THE INVENTION

Therefore, it is the object of the present invention to provide a keyboard for use in a handheld electronic device. The keyboard is free from the difficulties encountered during use of the conventional keyboard, thereby simplifying the input operation.

The other object of the present invention is to provide a keyboard having fewer keys without reducing the capability thereof, thereby reducing the dimension of the keyboard.

According to the present invention, a keyboard for a handheld electronic device is provided. The keyboard includes a plurality of input keys; a front panel adapted to be mounted on an outer surface of the handheld electronic device, the front panel being formed with a mounting hole for receiving a respective one of the input keys; a sliding and pressing mechanism disposed below the front panel to permit sliding movement of the respective input key in vertical and horizontal directions of the mounting hole so as to result in collision of the respective input key against a circuit within the handheld electronic device; and a spring unit disposed below the front panel for providing a restoration force that permits the respective input key to retrieve its initial position upon removal of an applied force for moving the respective input key along the vertical and horizontal directions.

BRIEF DESCRIPTION OF THE DRAWING

Other features and advantages of this invention will become more apparent in the following detailed description of the preferred embodiments of this invention, with reference to the accompanying drawings, in which.

DETAILED DESCCRIPTIONS OF THE PREFERRED EMBODIMENTS

Figure 1:
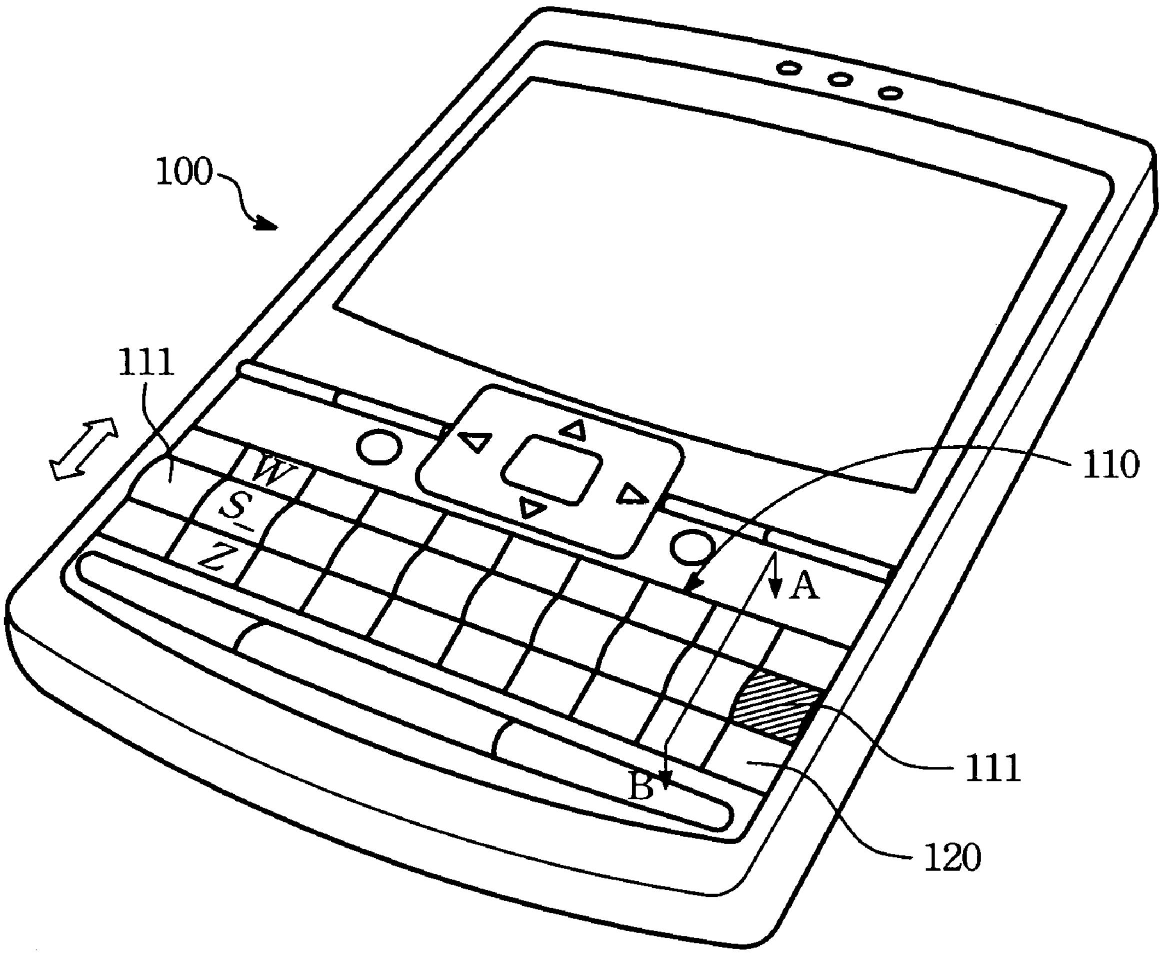
FIG. 1 is a handheld electronic device provided by the first preferred embodiment of a keyboard of the present invention.

FIG. 1 shows a perspective view of the first embodiment of a handheld electronic device 100 of the present invention. The handheld electronic device 100 includes a keyboard 110 consisting of a front panel 120 and a plurality of input keys 111. The keyboard 110 can be a QWERTY keyboard.

Each of the input keys 111 is slidable or pressible on the front panel 120 in the horizontal direction or the vertical direction (i.e. downward with respect to the front panel 120) similar to the conventional keyboard. The user can slide a respective input key 111 in the horizontal direction in order to input a letter. Alternately, the user can press the respective input key 111 downward with respect to the front panel 120 in the vertical direction in order to input the letter.

In this embodiment, each of the input keys 111 of the keyboard 110 is capable of inputting three different sets of letters including the first-set letter, the second-set letter and the third-set letter. To be more specific, when the input key 111 is moved forward in the horizontal direction, the first-set letter is generated. When the input key 111 is moved rearward in the horizontal direction, the second-set letter is generated.

When the input key 111 is pressed downward with respect to the front panel 120 in the vertical direction, the third-set letter is generated.

Furthermore, the forward, rearward and downward movement of the input key 111 with respect to the front panel 120 along the horizontal and vertical directions can be arranged to repeat for several times. If such arranged, each of the input keys 111 is capable of inputting more than three different sets of letters.

Referring to FIG. 1, where the first-set letter is [W], the second-set letter is [Z], and the third-set letter is [S], in case the input key 111 printed with [S] is moved forward in the horizontal direction so as to collide with the input key 111 printed with [W], the letter [W] is generated. When the input key 111 printed with [S] is moved rearward in the horizontal direction so as to collide with the input key 111 printed with [Z], the letter [Z] is generated. In the same manner, when the input key 111 printed with [S] is pressed downward with respect to the front panel 120 in the vertical direction, the letter [S] is generated. It can be arranged that a symbol [–] is generated in case the input key 111 printed with [S] is pressed downward twice with respect to the front panel in the vertical direction. Of course, the input keys 111 can be switched into other mode such that sliding movement of the input keys 111 in the horizontal direction and pressing action of the input keys 111 in the vertical direction may result in phonetic alphabet or Arabic numerals.

In this embodiment, a sliding and pressing mechanism 210 is employed in the keyboard 110 of the present invention so as to permit movement of the input keys 111 the horizontal or vertical direction. Furthermore, spring unit is also used to permit the input keys 111 to retrieve its initial position upon removal of an applied force.

Figure 2:
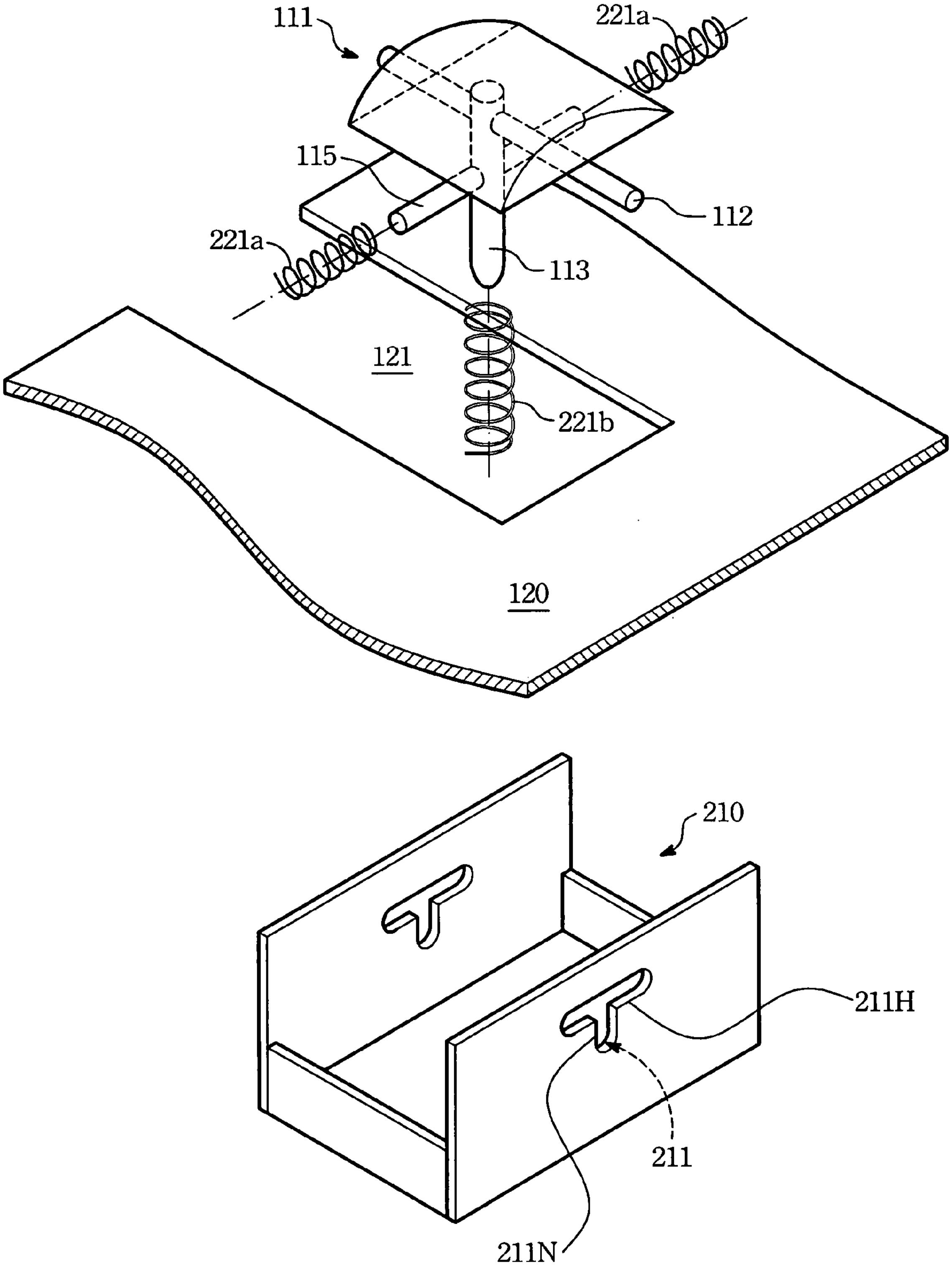
FIG. 2 is an exploded view of the first preferred embodiment of the keyboard of the present invention.

Referring to FIG. 2, the front panel 120 is mounted on an outer surface of the handheld electronic device 100. The front panel 120 is formed with a mounting hole or slot 121 for receiving a respective one of the input keys 111. As a matter of fact, two parallel long sides and two parallel short sides interconnecting to the long sides define the mounting hole 121. The input keys 111 are arranged along the longitudinal length of the mounting hole 121 in the front panel 120. Of course, the front panel 120 can be formed with a plurality of mounting holes 121, each receiving a respective input key 111.

The sliding and pressing mechanism 210 is disposed below the front panel 120 to permit sliding movement of the respective input key 111 in vertical or horizontal direction of said mounting hole 121 within the handheld electronic device 100.

The sliding and pressing mechanism 210 includes a plate member disposed below the front panel 120 and formed with a slot unit 211 having a horizontal portion 211H extending along the length of the mounting hole 121 and a vertical portion 211V integrally and downwardly extending from the horizontal portion 211H. The respective input key 111 has a vertical touch rod 113 and two horizontal touch rods 115 projecting transversely from the vertical touch rod 113. The respective input key 111 further has two sliding arms 112 projecting transversely from the vertical touch rod 113 and disposed at an elevation higher than the horizontal touch rods 115 respectively. The sliding arms 112 extend slidably within the slot unit 211 in the plate member. The vertical touch rod 113 is capable of contacting a first circuit (not shown) of the handheld electronic device 100 so as to generate a first signal when the respective input key 111 is pressed downward relative to the front panel 120 in the vertical direction. Each of the horizontal touch rods 115 is capable of contacting a second circuit (not shown) of the handheld electronic device so as to generate a second when the respective input key 111 is moved along the horizontal direction.

The spring unit provides a restoration force that permits the respective input key 111 to retrieve its initial position upon removal of the applied force for moving the respective input key 111 along the vertical or horizontal direction. The spring unit includes a plurality of compression springs 221*a*, 221*b* respectively sleeved around the vertical and horizontal touch rods 115, 113 for restoring the respective input key 111 to its initial position upon removal of the applied force.

Figure 3:
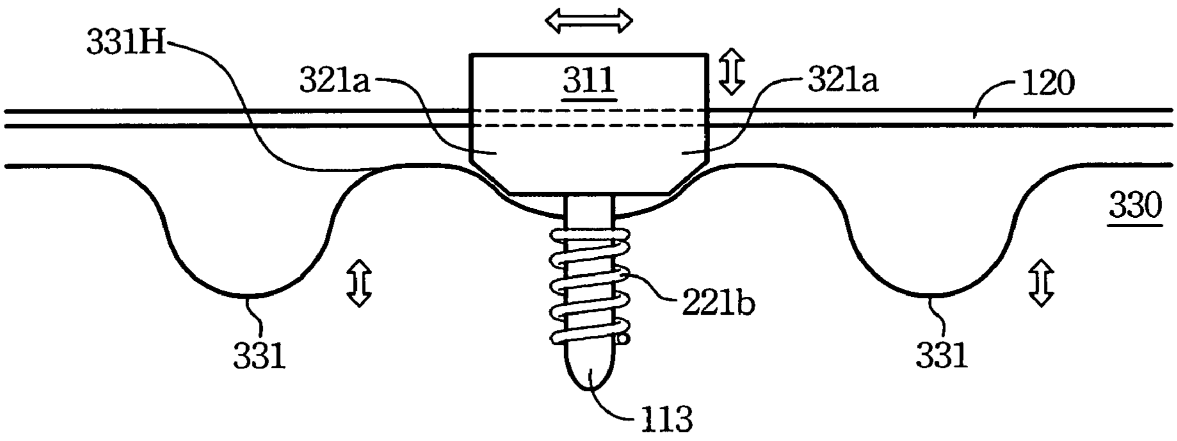
FIG. 3 is a partly sectional view of the second preferred embodiment of the keyboard of the present invention taken along the line A-B in FIG. 1.

FIG. 3 is a partly sectional view of the second preferred embodiment of the keyboard of the present invention taken along the line A-B in FIG. 1. The second preferred embodiment has the structure similar to the first preferred embodiment.

The only difference resides in that the spring unit of the second preferred embodiment includes a flexible spring plate 330 that is disposed below the front panel 120 and that has an upper convex portion 331H adjacent to the front panel 120 and a lower concave portion 331 distal to the front panel 120. The spring plate 330 is preferably made from flexible materials, such a thin metal strip or plastic material so long it can restore the respective input key 311 to its initial position and so long it can activate the second circuit. The input key 311 has two opposite horizontal touch faces 321*a*.

The sliding movement of the respective input key 311 along the horizontal direction results in collision of the respective touch face 321*a* of the input key 311 against the upper convex portion 331H, thereby causing deformation of the spring plate 330 so as to lower the lower concave portion 331 to contact the second circuit (not shown) of the handheld electronic device to generate a second signal.

In short, the keyboard of the present invention is compact in size and free from the drawbacks of the prior art keyboard.

In above embodiment, although all the three different sets of letters are English letters, they also can be phonetic alphabets and Arabic numerals or symbols without restriction. Besides, the arrangement of the keyboard is not limited to the disclosed embodiment either.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A keyboard for a handheld electronic device, the keyboard comprising:

a plurality of input keys, each of said plurality of input keys having a pair of sliding arms;

a front panel adapted to be mounted on an outer surface of the handheld electronic device, said front panel being formed with a mounting hole for receiving a respective one of said input keys;

a sliding and pressing mechanism disposed below said front panel to permit sliding movement of said respective input key in vertical or horizontal direction of said mounting hole, said sliding and pressing mechanism having a pair of sidewalls standing oppositely for accommodating each of said plurality of input keys therebetween, each of the pair of sidewalls having a T-shaped slot unit, said T-shaped slot unit having a horizontal portion extending along said horizontal direction and a vertical portion extending along said vertical direction; and a spring unit disposed below said front panel for providing a restoration force that permits said respective input key to retrieve its initial position upon removal of an applied force for moving said respective input key along said vertical or horizontal direction, wherein said sliding arms of each of said plurality of input keys being extended outward and disposed slidably within corresponding T-shaped slot unit of the sliding and pressing mechanism so as to allow said input key to slide along said horizontal direction while said sliding arms sliding in said horizontal portion of said T-shaped slot unit and to allow said input key to slide along said vertical direction while said sliding arms sliding in said vertical portion of said T-shaped slot unit.

2. The keyboard according to claim 1, wherein said respective input key has a vertical touch rod and a horizontal touch rod projecting transversely from said vertical touch rod, said vertical touch rod capable of contacting a first circuit of the handheld electronic device when said respective input key is pressed downward relative to said front panel in said vertical direction, said horizontal touch rod capable of contacting a second circuit of the handheld electronic device when said respective input key is moved along said horizontal direction.

3. The keyboard according to claim 2, wherein said spring unit includes a plurality of compression springs respectively sleeved around said vertical and horizontal touch rods for restoring said respective input key to its initial position upon removal of said applied force.

4. The keyboard according to claim 2, wherein said spring unit includes a flexible spring plate disposed below said front panel and, sliding movement of said respective input key along said horizontal direction resulting in collision of said respective input key against said spring plate, thereby causing deformation of said spring plate so as to lower said spring plate to contact the second circuit of the handheld electronic device.

5. The keyboard according to claim 1, wherein sliding movement of said respective input key along said horizontal direction in a frontward results in a first-set letter, sliding movement of said respective input key along said horizontal direction in a rearward resulting in a second-set letter, sliding and downward movement of said respective input key along said vertical direction with respect to said front panel resulting in a third-set letter.

6. The keyboard according to claim 5, wherein said first-set letter is an English letter, said second-set letter being a phonetic alphabet, said third-set letter being an Arabic numeral or a symbol.

7. The keyboard according to claim 1, wherein said mounting hole is defined by two parallel long sides and two parallel short sides interconnecting to said long sides.

8. The keyboard according to claim 7, wherein said plurality of input keys are arranged along the longitudinal length of said mounting hole in said front panel.

9. The keyboard according to claim 1, wherein the keyboard is a QWERTY keyboard.

* * * * *